(12) United States Patent
Summa et al.

(10) Patent No.: US 12,242,291 B2
(45) Date of Patent: Mar. 4, 2025

(54) CURRENT CONTROLLED VOLTAGE REGULATOR TESTING

(71) Applicant: Infineon Technologies AG, Neubiberg (DE)

(72) Inventors: Veikko Summa, Villach (AT); Manfred Bresch, Villach (AT)

(73) Assignee: Infineon Technologies AG, Neubiberg (DE)

( * ) Notice: Subject to any disclaimer, the term of this patent is extended or adjusted under 35 U.S.C. 154(b) by 238 days.

(21) Appl. No.: 17/932,751

(22) Filed: Sep. 16, 2022

(65) Prior Publication Data
US 2024/0094751 A1   Mar. 21, 2024

(51) Int. Cl.
| | |
|---|---|
| G01R 31/40 | (2020.01) |
| G05F 1/46 | (2006.01) |
| G05F 1/565 | (2006.01) |
| H02M 1/00 | (2007.01) |

(52) U.S. Cl.
CPC .............. *G05F 1/465* (2013.01); *G05F 1/565* (2013.01); *G01R 31/40* (2013.01); *H02M 1/0025* (2021.05)

(58) Field of Classification Search
CPC ..... G05F 1/465; G05F 1/565; G01R 31/2851; G01R 31/2879; G01R 31/2884; G01R 31/40; G11C 29/021; G11C 29/028; G11C 29/56
See application file for complete search history.

(56) References Cited

U.S. PATENT DOCUMENTS

| | | | |
|---|---|---|---|
| 6,717,389 B1 | 4/2004 | Johnson | |
| 7,256,571 B1 | 8/2007 | Mimberg et al. | |
| 9,759,765 B2* | 9/2017 | Gorman | G01R 31/31715 |
| 2001/0002102 A1* | 5/2001 | Petricek | H02M 3/1584 |
| | | | 323/224 |
| 2007/0210853 A1* | 9/2007 | Maejima | G11C 5/145 |
| | | | 327/536 |
| 2007/0279018 A1 | 12/2007 | Sumitomo et al. | |
| 2016/0218625 A1* | 7/2016 | Chen | H02M 3/33523 |
| 2017/0045575 A1* | 2/2017 | Shaikh | G01R 31/2853 |
| 2018/0335792 A1* | 11/2018 | Kuchipudi | G06F 1/266 |
| 2020/0412234 A1* | 12/2020 | Hayakawa | H02M 3/156 |
| 2021/0148968 A1* | 5/2021 | Wells | G01R 31/2884 |

(Continued)

FOREIGN PATENT DOCUMENTS

WO   WO-2021242333 A1 * 12/2021 ............ G01R 31/40

*Primary Examiner* — Fred E Finch, III
(74) *Attorney, Agent, or Firm* — Banner & Witcoff Ltd.

(57) ABSTRACT

The disclosure is directed to the use of an externally-supplied control current to control the adjustment of an internal supply voltage generated via voltage regulator circuitry, which may be identified with an integrated circuit (IC) chip. The configuration of the voltage regulator circuitry functions to establish a linear relationship between the control current and the internal voltage supply. This configuration enables setting the control current to a predetermined value, causing the supply voltage to deviate in a predictable and controllable manner, and thus facilitating verification of the IC chip's internal voltage supply test circuitry. Furthermore, because the control current used for this purpose is relatively small (e.g. on the order of microamps), existing on chip test architecture, which may accommodate such low level currents, may be re-used for the selective routing of the control current for such IC testing.

22 Claims, 6 Drawing Sheets

(56) References Cited

U.S. PATENT DOCUMENTS

| | | |
|---|---|---|
| 2022/0045606 A1 | 2/2022 | Lee et al. |
| 2023/0299670 A1* | 9/2023 | Cattani ............... H02M 1/0003 323/282 |
| 2023/0315136 A1* | 10/2023 | Surkanti ................ G05F 1/468 323/275 |

* cited by examiner

CURRENT CONTROLLED VOLTAGE REGULATOR TESTING

TECHNICAL FIELD

The embodiments described herein generally relate to the testing of integrated circuit (IC) voltage regulators and, in particular, to using a current-controlled IC voltage regulator testing solution.

BACKGROUND

Integrated circuits (ICs) typically have several components depending upon their intended functionality. These components operate using internally-generated supply voltages, which may be generated via one or internal voltage regulators. For instance, ICs may have several voltage regulators, each generating a respective regulated voltage that is used as a supply voltage for respective IC components. Such voltage regulators are widely used, and typically generate a stable supply voltage using an internal reference voltage and an external supply voltage.

Moreover, because such supply voltages are critical to IC operation, the supply voltages are typically monitored via internal IC test circuitry. Such monitoring may be performed by identifying deviations in the supply voltage, such as increases or decreases beyond predetermined threshold voltage values. When such deviations are detected, the internal IC test circuitry may output one or more monitoring signals to indicate that an internal supply voltage malfunction. Thus, the manufacturing process of the IC includes testing this internal test circuitry to verify that such internal supply voltage deviations are accurately and consistently identified during normal IC operation. However, the current techniques used to perform such tests are inadequate.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The example aspects of the present disclosure will be described with reference to the accompanying drawings. The drawing in which an element first appears is typically indicated by the leftmost digit(s) in the corresponding reference number.

SUMMARY

Figure 1:
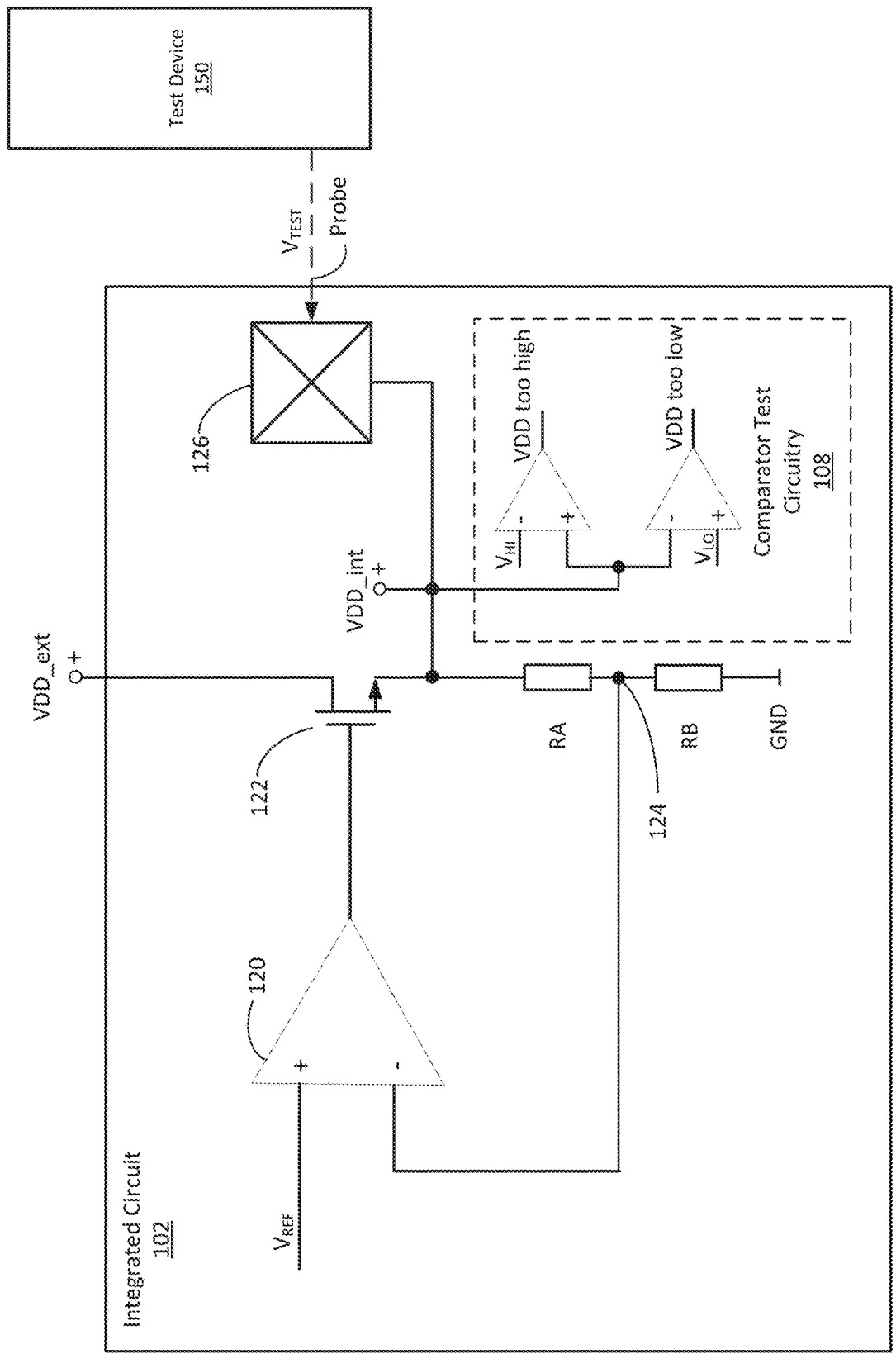
FIG. 1 illustrates a conventional voltage regulator test configuration.

Again, during manufacturing the functionality of the internal IC test circuitry is tested to verify its ability to accurately detect internal supply voltage deviations. This often requires modifying the internal supply voltages to emulate the conditions that are to be tested, i.e. to cause deviations in the internal supply voltage beyond the threshold test voltages to verify the internal test circuitry is functioning. Traditionally, this is achieved by directly placing a metal pad at the location of the IC identified with the internal supply voltage to be altered via this testing procedure, and then applying a probe needle card as part of a frontend test device, resulting in the internal supply voltage (i.e. the regulator voltage) being overridden.

However, for many technologies in which no active area is provided to perform such testing, the inclusion of the metal pad for this use translates into a direct area penalty, as the metal pad needs to be added specifically for testing purposes as opposed to accessing existing portions of the IC to do so. Moreover, for other technologies in which access to IC components is part of the IC design, the re-use of such exposed components still presents a limitation as it is generally inadvisable to place matching structures under such exposed pads, as needle pressure might impact matching.

Furthermore, conventional approaches for verifying the operation of the internal IC test circuitry only allows for frontend test architectures, as the metal pad is only accessible in this manner. Thus, conventional test procedures do not allow for the metal pad to be used during backend testing or debugging in lab. Still further, the external test device needs to have adequate current sourcing capability to override the voltage regulator by brute force. Depending on the IC chip that is tested, this may require significantly large currents, which may result in heating the metal pad and surrounding region, leading to unexpected side effects that may impair the accuracy of the test procedure.

Further complicating this issue, in most cases IC chips comprise several voltage regulators, each generating a respective internal supply voltage. Each of these separate supply voltages needs to be internally monitored via the aforementioned test circuitry, and in each case the test circuitry also needs to be verified. Thus, for IC chips having multiple internal voltage regulators, a significant amount of area is wasted as a metal pad needs to be dedicated to facilitate verification of the test circuitry of each supply voltage. And because it is preferable to test each supply voltage at the same time, the probe needle card used for testing needs to be designed to interface with each metal pad, which adds to the cost, complexity, and reliability of the probe needle card.

Therefore, the embodiments as discussed in further detail herein aim to address these issues by providing a "control" or "test" current at a feedback divider of each internal supply voltage for which the internal test circuitry is to be verified. This technique is in contrast with the conventional manner of directly overriding the output voltage generated by the voltage regulator. This circuit configuration enables the internal supply voltage to deviate in a linear manner as a function of the amplitude and polarity of the control current, and thus the internal supply voltage may be altered by sinking or sourcing a control current on the order of a few microamps. And because the control current is significantly small, an internal test multiplexer of the IC may be re-used for such testing purposes to selectively route the control current to each voltage regulator feedback divider in this manner. This is feasible because the internal test multiplexer and coupled internal test bus (which also advantageously often has access to a pin) is capable of handling currents on the order of milliamps, although the use of a conventional techniques mentioned above may result in currents that exceed these internal test bus capabilities. As a result, the embodiments described herein also advantageously allow for the verification of internal IC test circuitry without introducing an area penalty, since the pin or test bus-pad is already present as part of the IC design independent of this testing procedure.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

FIG. 1 illustrates a conventional voltage regulator test configuration. As shown in FIG. 1, the voltage regulator test configuration 100 comprises an integrated circuit (IC) or IC chip 102, and an external test device 150. The IC chip 102 includes voltage regulator circuitry comprising an operational amplifier 120, a transistor 122, and a voltage divider formed by the resistors RA and RB. As shown in FIG. 1, the transistor 122 is implemented as an N-type MOSFET, has a gate terminal coupled to the output of the operational amplifier 120, a drain terminal coupled to an external supply voltage VDD_ext, and a source terminal coupled to the internal supply voltage VDD_int. Under ordinary operation, the transistor 122 conducts, and thus the internal supply voltage VDD_int is slightly less than the external supply voltage VDD_ext, with the difference being due to the voltage drop across the source-drain terminals of the transistor 122.

Furthermore, the non-inverting input terminal of the operational amplifier 120 is coupled to a reference voltage $V_{REF}$, with the inverting input terminal being coupled to the node 124 of the voltage divider, i.e. the junction of the resistors RA and RB. As a result of the virtual short circuit formed between the input terminals of the operational amplifier 120, the voltage at the node 124 is maintained at the reference voltage $V_{REF}$. In other words, the operational amplifier 120 supplies a voltage to the gate of the transistor 122 such that its negative input (and thus the internal supply voltage VDD_int) follows its positive input (the reference voltage $V_{REF}$), due to the effect of negative feedback. Any perturbation of the input current (i.e. the current associated with the external supply voltage VDD_ext, the load current, or even other currents), will briefly affect the internal supply voltage VDD_int, but the feedback loop will quickly adjust the driving of the gate of the transistor 122 to stabilize the internal supply voltage VDD_int. Thus, the values of the resistors RA and RB, as well as the reference voltage $V_{REF}$, may be selected such that the internal supply voltage VDD_int is maintained proportional to the reference voltage $V_{REF}$ by way of the voltage regulator circuitry architecture. In this way, the feedback loop maintains the relationship VDD_int=Vref*(RA+RB)/RB.

With continued reference to FIG. 1, the test device 150 is coupled to the IC chip 102 via the on-chip pad 126, and a test voltage $V_{TEST}$ is applied via a probe needle card to override the internal supply voltage VDD_int provided by the voltage regulator circuitry by "brute force." To achieve this, either a large current must be injected into the IC 102 via the test pad 126, or the voltage regulator circuitry must be switched off by forcing the transistor 122 to have a high impedance. However, switching off regulators is always critical, because the switch control signals may become undefined as a result. Thus, the internal supply voltage VDD_int is adjusted in this manner to the test voltage $V_{TEST}$ to emulate a condition in which the internal supply voltage VDD_int exceeds a threshold high voltage ($V_{HI}$) and/or is less than a threshold low voltage ($V_{LO}$). The IC chip 102 also includes comparator test circuitry 108, which includes a pair of comparators, each configured to compare the internal supply voltage VDD_int to the threshold high voltage $V_{HI}$ and the threshold low voltage $V_{LO}$, respectively.

Therefore, the threshold high test voltage $V_{HI}$ and the threshold low test voltage $V_{LO}$ may be selected as any suitable voltage values that are greater than and less than, respectively, the internal supply voltage VDD_int. Under ordinary operation, the comparator test circuitry 108 functions to generate an output monitoring signal "VDD too high" when the internal supply voltage VDD_int exceeds the threshold high voltage $V_{HI}$, and generates an output monitoring signal "VDD too low" when the internal supply voltage VDD_int is less than the threshold low voltage $V_{LO}$. The functionality of the comparator test circuitry 108 may thus be tested, for example, by the test device 150 adjusting the test voltage $V_{TEST}$ to cause the internal supply voltage VDD_int to be greater than the threshold high voltage $V_{HI}$, and to be less than the threshold low voltage $V_{LO}$, and then in response verifying the generation of the respective "VDD too high" and "VDD too low" output monitoring signals.

Again, although the test setup 100 as shown in FIG. 1 facilitates the testing of the comparator test circuitry 108, the use of a brute force technique to override the internal supply voltage has various drawbacks, as noted herein. Therefore, the embodiments as discussed herein implement a current-controlled voltage regulator testing technique, which provides several advantages over the test setup 100. Examples of these embodiments and their accompanying advantages are further discussed immediately below.

Figure 2:
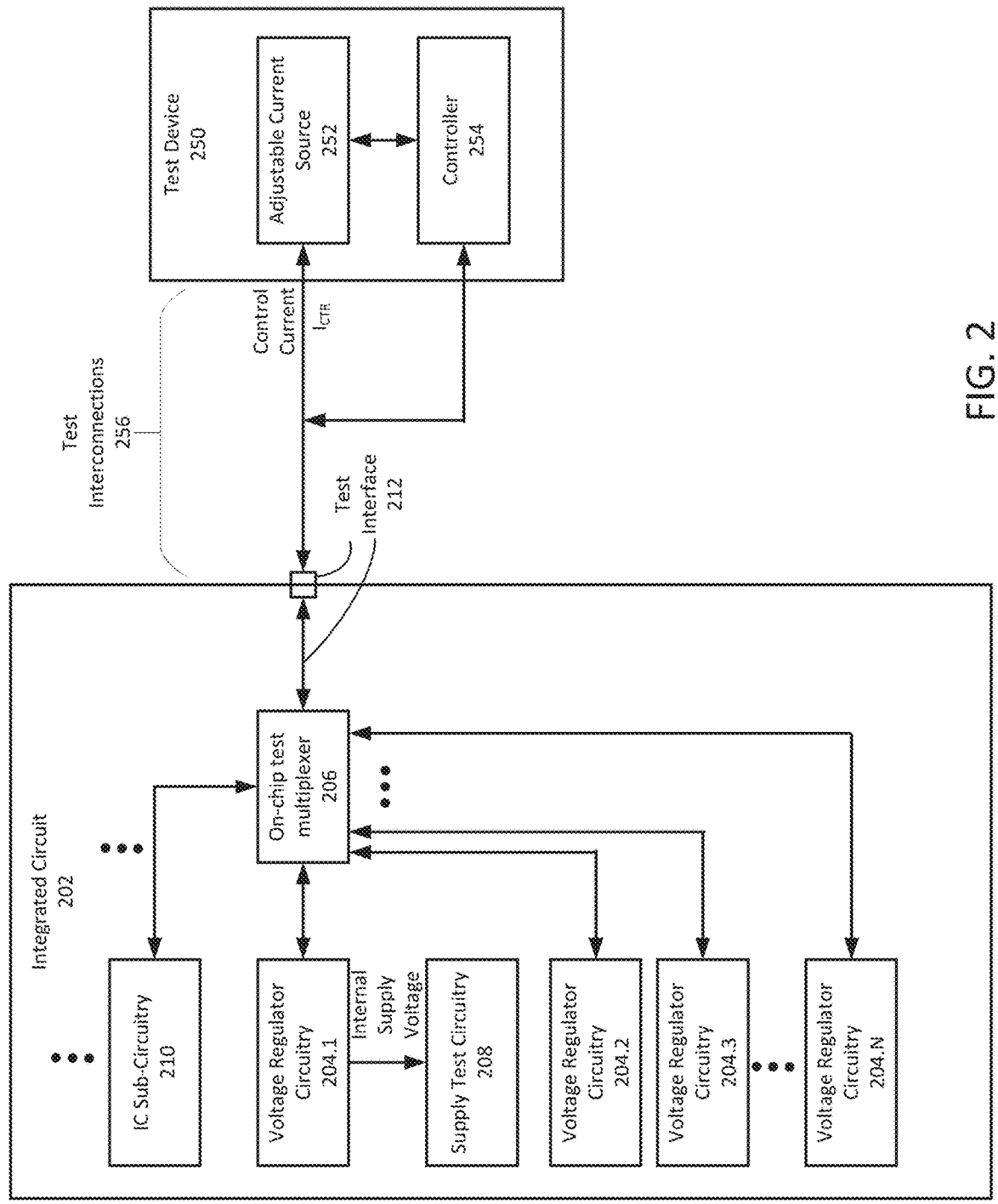
FIG. 2 illustrates an example current-controlled voltage regulator test configuration, in accordance with an embodiment of the present disclosure.

FIG. 2 illustrates an example current-controlled voltage regulator test configuration, in accordance with an embodiment of the present disclosure. The test configuration 200 as shown in FIG. 2 includes an integrated circuit (IC) 202 and a test device 250, which are coupled to one another via test interconnections 256. The IC 202 may be implemented as any suitable type of IC, which may alternatively be referred to herein as an IC chip. For example, the IC chip 202 may comprise any suitable type of sensor IC, a system on a chip (SoC), an application-specific integrated circuit (ASIC), a field programmable gate array (FPGA), etc. The IC chip 202 may be configured with any suitable number and/or type of components in accordance with its particular application. For instance, the IC chip 202 may implement one or more electronic components and/or circuitry, which may include communication systems, buses, sensors, ports, antennas, etc.

To provide an illustrative example with reference to FIG. 2, the IC chip 202 may include IC sub-circuitry 210, which may be identified with any suitable number and/or type of electronic components implemented by the IC chip 202. For instance, the IC sub-circuitry 210 may include analog-to-digital converters (ADCs), digital-to-analog converters (DACs), drivers, communication sub-systems, processing circuitry, memory, sensors, etc. The IC sub-circuitry 210 may thus form a part of the IC chip 202 and enable the IC chip 202 to carry out its intended functions in conjunction with the internal supply voltages provided by the voltage regulator circuitries 204.1-204.N, as further discussed herein.

Furthermore, the IC chip 202 may include any suitable number N of voltage regulator circuitries 204.1-204.N, an on-chip (i.e. internal) test multiplexer 206, and on-chip (i.e. internal) supply test circuitry 208. Each of the voltage regulator circuitries may be implemented as any suitable number and/or type of electronic components configured to generate a respective internal supply voltage, and may operate in a similar manner as the voltage regulator circuitry described above with respect to the voltage regulator of the IC chip 102. Thus, each voltage regulator circuitry 204.1-204.N may comprise one or more operational amplifiers, one or more transistors, one or more voltage dividers, etc. Additional details regarding the voltage regulator circuitries 204.1-204.N are discussed below with respect to FIGS. 3A and 3B.

Again, the IC chip 202 may be implemented in accordance with any suitable type of application, which may include applications that are required to meet the Automotive Safety Integrity Level (ASIL) safety scheme or other suitable applications, and may be required to meet certain regulatory requirements and/or are subjected to regulatory testing or other testing requirements. As part of these requirements, the IC chip 202 may need to test the ability to monitor the voltages generated by the voltage regulator circuitries 204.1-204.N, as well as other portions of the IC chip 202 such as the IC sub-circuitry 210. To do so, the IC chip 202 may comprise supply test circuitry 208, which may be configured in a similar or identical manner and function in a similar or identical manner as the comparator test circuitry 108 as discussed above with respect to FIG. 1.

Thus, although a single supply test circuitry 208 is shown in FIG. 2 for purpose of brevity, which is coupled to the voltage regulator circuitry 204.1, the IC chip 202 may comprise any suitable number of such test circuitries, each being configured to test a respective voltage regulator circuitry 204.1-204.N or, alternatively, be shared among one or more of the voltage regulator circuitries 204.1-204.N, in various embodiments. In any event, the supply test circuitry 208 is configured to identify deviations in the internal supply voltages generated via one or more (or all) of the voltage regulator circuitries 204.1-204.N, which may include generating output monitoring signals indicating that the internal supply voltage is too high or too low, as noted above with reference to the comparator test circuitry 108 of the IC 102 in FIG. 1.

Moreover, the IC 202 may comprise an on-chip test multiplexer 206, which functions to selectively route signals between the various components of the IC chip 202 for test procedures or for any suitable purpose. For example, the on-chip test multiplexer 206 may comprise any suitable arrangement of switches, which may be implemented as solid state (e.g. transistors), mechanical, electro-mechanical, or any combination thereof. In any event, the on-chip test multiplexer 206 may selectively couple any suitable portions of the IC chip 202 to one another in various arrangements based upon one or more control signals (not shown). For example, the on-chip test multiplexer 206 may be coupled to any suitable number of wired interconnections, buses, ports, etc., which enable coupling of each of the components of the IC chip 202 that are to be subjected to testing to a suitable terminal, bus, port, etc., thereby facilitating the testing to be carried out using the appropriate electrical signals, voltages, currents, etc.

For instance, the IC chip 202 may include various interconnections not shown in FIG. 2 for purposes of brevity, and thus the on-chip test multiplexer 206 may enable the selective coupling of electrical signals, voltages, currents, etc. to the various components within the IC chip 202 to facilitate other types of testing in addition to or instead of those discussed herein. Again, such testing may be performed in accordance with existing or known IC chip architectures to meet regulatory requirements, particularly with respect to operational safety. Thus, the embodiments discussed herein may advantageously leverage the on-chip test multiplexer 206, which may already be present in many conventional IC chip designs, to perform the testing of the supply test circuitry 208. To do so, the on-chip test multiplexer 206 is configured to selectively couple and route a control current provided via the test device 250 (i.e. sourced or sunk) to adjust the internal supply voltage of one or more (or all) of the internal supply voltages generated by the voltage regulator circuitries 204.1-204.N. In this way, the supply test circuitry 208 may be tested by verifying the generation of the appropriate output monitoring signals (e.g. "VDD too high" and "VDD too low") in response to a predetermined deviation of the internal supply voltage from an operating range, as further noted herein.

To do so, the embodiments as discussed herein include modifying the voltage regulator test circuitries 204.1-204.N from the conventional IC test architecture, as further discussed below with respect to FIGS. 3A and 3B. Moreover, the embodiments discussed herein include modifying the on-chip test multiplexer 206, which again may be part of an existing IC chip design, to enable selectively coupling a portion of the voltage regulator circuitries 204.1-204.N to a test interface 212. The test interface 212 may be identified, for instance, with any suitable portion of the IC chip 202 that is configured to a selectively couple (e.g. when a test process is being performed) the control current between the external test device 250 and the IC chip 202.

For example, the test interface 212 may comprise an electrically-conductive test pad, a terminal, a pin, etc., as well as one or more buses or other suitable electrically-conductive interconnections that enable the control current to be coupled from the external test device 250 to the on-chip test multiplexer 206. The on-chip test multiplexer 206, in turn, enables the control current to be selectively coupled between one or more (or all) of the voltage regulator circuitries 204.1-204.N and the test device 250. As noted above, the test interface 212 may be used to perform other types of testing, and thus the embodiments described herein may advantageously re-use at least portions of the test interface 212 to perform testing of the voltage regulator circuitries 204.1-204.N, and in doing so advantageously allow for the test procedures as discussed herein to be performed without suffering a direct area penalty of IC area.

The test device 250 may be implemented as any suitable type of hardware, software, or combinations of these, which function to enable the test device 250 to generate a control current, denoted herein as $I_{CTR}$ (e.g. a direct current (DC) current) of any suitable amplitude that is sourced out of or sunk into the IC chip 202. The control current may be coupled to the test interface 212 via any suitable electrical conductor, which may be represented as the test interconnections 256 as shown in FIG. 2, and which may include e.g. probe needle cards or any other suitable type of interface to facilitate at least a temporary coupling between the IC chip 202 and the test device 250.

In an embodiment, the test device 250 may implement an adjustable current source 252 and a controller 254. The adjustable current source 252 may have any suitable configuration or architecture, and be implemented as any suitable number and/or type of electronic components to source or sink a control current having any suitable amplitude. For example, the adjustable current source 252 may be configured to generate a control current having an amplitude within a range of currents represented as $+I_{CTR}$ and $-I_{CTR}$, with the polarity (±) of the control current indicating the direction with respect to the IC chip 202 (i.e. sourced out of (−) or sunk into (+) the IC chip 202). The adjustable current source 252 is configured to generate the control current in response to control signals received from the controller 254, which may be controlled in a digital manner, an analog manner, or combinations of these. The adjustable current source 252 may be configured to generate the control current within a range of currents $+I_{CTR}$ and $-I_{CTR}$ and in accordance with any suitable step size or granularity therebetween (e.g. when digital control is used).

The controller 254 may be implemented as any suitable type of hardware, software, or combinations of these, which function to enable the adjustable current source 252 to generate a control current that is coupled to the IC chip 202 to perform testing of the supply test circuitry 208. The controller 254 may be implemented as one of more processors and/or processing circuitry, and may execute computer-readable instructions to generate control signals, communicate with the adjustable current source 252, or otherwise cause the adjustable current source 252 to generate the control current as discussed in further detail herein. The controller 254 may thus be implemented using any suitable type of architecture and function in accordance with any suitable type of application that enables the control and overall operation of the test device 250.

Additionally or alternatively, the test device 250 may interface with the IC chip 202 via the test interface 212 and the on-chip test multiplexer 206 to perform other types of tests, to communicate with one or more components of the IC chip 202, and/or to identify the results of the verification of the supply test circuitry 208 as discussed herein (e.g. to be provided with the monitoring signals and/or the status of the monitoring signals output by the supply test circuitry 208). Thus, the test interconnections 256 formed between the IC chip 202 and the test device 250 as shown in FIG. 2 may represent any suitable number and/or type of ports, probes, pins, terminals, buses, etc., which function to couple the IC chip 202 and the test device 250 to one another at least temporarily such that the testing of the supply test circuitry 208 may be performed in accordance with the embodiments as discussed herein. Of course, the interconnections and functionality of the test device 250 in addition to those used to generate and couple the control current to the IC 202 are optional, may be performed by a device separate from the test device ×(not shown), and/or may be performed by the IC 202 (not shown).

Figure 3A:
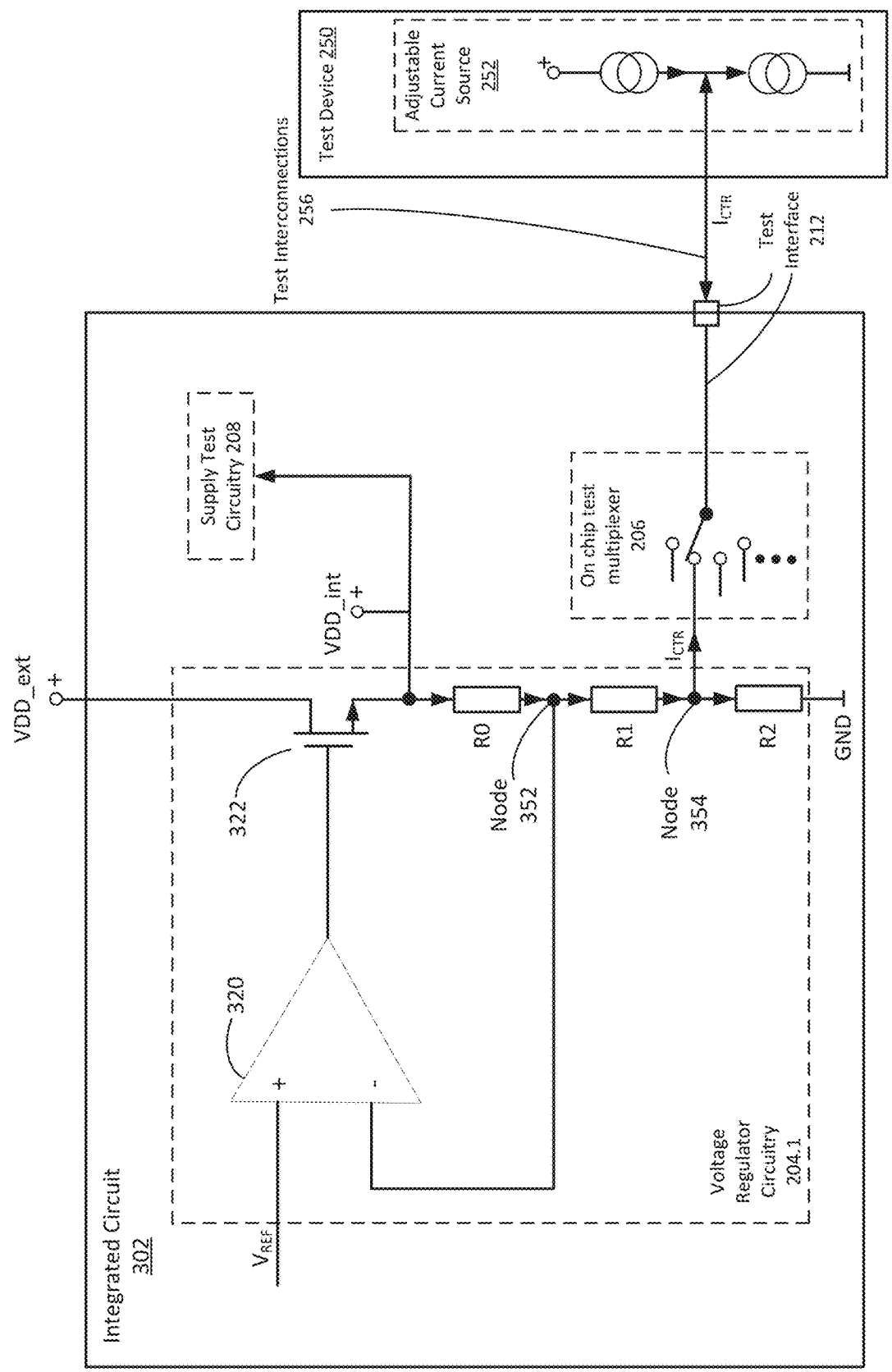
FIG. 3A illustrates additional details of the example current-controlled voltage regulator test configuration as shown in FIG. 2, in accordance with an embodiment of the present disclosure.

FIG. 3A illustrates additional details of the example current-controlled voltage regulator test configuration as shown in FIG. 2, in accordance with an embodiment of the present disclosure. The test configuration 300 as shown in FIG. 3A includes an IC chip 302, which may be identified with the IC chip 202 as shown in FIG. 2. The test configuration 300 also includes the test device 250 as shown in FIG. 2, which is coupled to the IC chip 302 via the test interface 212 and the test interconnections 256. The IC 302 is shown in FIG. 3A as implementing a single voltage regulator circuitry 204.1 for purposes of brevity and ease of explanation, as well as a single supply test circuitry 208. However, and as noted above for the IC chip 202, the IC chip 302 may implement any suitable number of such components, and the IC 302 is illustrated in FIG. 3A by way of example and not limitation.

The IC 302 also includes voltage regulator circuitry, which may be identified with the voltage regulator circuitry 204.1-204.N as shown in FIG. 2. For ease of explanation, a single voltage regulator circuitry of the IC chip 302 is shown, and is discussed herein as being identified with the voltage regulator circuitry 204.1 as shown in FIG. 2. The voltage regulator circuitry 204.1 as shown in FIG. 3A is configured to generate an internal supply voltage VDD_int based upon an external supply voltage VDD_ext and a reference voltage $V_{REF}$, and has a similar architecture as the voltage regulator as shown in FIG. 1. For example, the voltage regulator circuitry 204.1 comprises an operational amplifier 320 having a non-inverting input coupled to the reference voltage $V_{REF}$, and an inverting input coupled to a node 352 of a first voltage divider formed by the resistors R0 and R1. Thus, the resistor R0 is coupled to the internal supply voltage VDD_int and to the node 352. The node 352 is formed between the resistors R0 and R1 of the first voltage divider, and is maintained at the reference voltage $V_{REF}$ by way of the virtual short circuit between the input terminals of the operational amplifier 320. That is, the resistors R0 and R1 are each coupled to the inverting input of the operational amplifier 320, which is in turn coupled to the reference voltage $V_{REF}$, such that the node 352 is also maintained at the reference voltage $V_{REF}$.

The voltage regulator circuitry 204.1 further comprises a transistor 322, which has a gate terminal coupled to the output of the operational amplifier 320. The transistor 322 may be implemented as any suitable type of transistor, such as the N-type MOSFET as shown, and has a drain terminal coupled to the external supply voltage VDD_ext and a source terminal coupled to a node identified with the internal supply voltage VDD_int. Thus, and as discussed above with respect to FIG. 1, under ordinary operation the transistor 322 conducts, and thus the internal supply voltage VDD_int is slightly less than the external supply voltage VDD_ext, with the difference again being due to the voltage drop across the source-drain terminals of the transistor 322.

Thus, the voltage regulator circuitry 204.1 operates in a similar manner as the voltage regulator of the IC 102 as discussed above with respect to FIG. 1, such that the voltage regulator circuitry 204.1 also provides a stable internal supply voltage VDD_int based upon the external voltage VDD_ext and the reference voltage $V_{REF}$. Moreover, the IC chip 302 also comprises supply test circuitry 208, as shown in FIG. 2, which may have an identical or similar architecture as, and operate in a similar or identical manner to, the comparator test circuitry 108 as shown and discussed above with reference the IC chip 102 of FIG. 1. Thus, the supply test circuitry 208 is configured to monitor fluctuations in the internal supply voltage VDD_int above or below a respective threshold high voltage ($V_{HI}$) and a threshold low voltage ($V_{LO}$) Other common functionalities of the IC chip 302 and the conventional IC chip 102 are not further discussed herein for purposes of brevity.

It is noted that the voltage regulator 204.1 differs from that of the IC chip 102 in that the voltage regulator 204.1 comprises two voltage dividers coupled in series with one another to form a multi-tap architecture, in contrast with the single tap voltage divider architecture implemented by the IC chip 102. That is, the conventional IC chip 102 implements a single tap voltage divider, the tap being formed via a junction between the resistors RA and RB and, as a result, generates a relatively large current that flows through the resistors RA and RB to ground via the use of the applied test voltage at the test pad as shown in FIG. 1.

In contrast, the voltage regulator circuitry 204.1 of the IC chip 302 may implement a set of any suitable number N of resistors greater than two, which are coupled in series with one another between the internal supply voltage VDD_int and a reference potential. Thus, the set of N resistors may comprise a voltage divider having any suitable number of taps (interchangeably referred to herein as nodes) that are formed between each of the resistor-to-resistor junctions (i.e. the connection), and which may be N−1 taps in the example as shown in FIG. 3A. Furthermore, and in the example shown in FIG. 3A, N=3, as the set of resistors includes the resistors R0, R1, and R2. Thus, two taps are formed, which are labeled as the nodes 352, 354. As shown in FIG. 3A, in this configuration, one tap of the voltage divider (i.e. the node 352 formed by the connection between the resistors R0 and R1) is coupled to the inverting input of the operational amplifier 320, whereas the other tap of the voltage divider (i.e. the node 354 formed by the connection between the resistors R1 and R2) is coupled to the on-chip test multiplexer 206.

Thus, the multi-tap voltage divider formed by the resistors R0, R1, and R2 may alternatively be referred to as comprising two voltage dividers that are coupled in series with one another. As shown in FIG. 3A, the voltage divider formed by the resistors R0, R1, and R2 comprises a first voltage divider comprising the resistors R0 and R1, and a second voltage divider comprising the resistors R1 and R2. The first voltage divider is coupled to the internal supply voltage VDD_int via the resistor R0, and the second voltage divider is coupled to the reference potential via the resistor R2. Again, the resistor R0 is coupled to each of the internal supply voltage VDD_int (on one side) and to the inverting input of the operational amplifier 320 (on the other side via the node 352). The resistor R1 is also coupled to the inverting input of the operational amplifier 320 (via the node 352) as well as to the on chip test multiplexer 206 (via the node 354). The resistor R2 is also coupled to the on chip test multiplexer 206 via the node 354 and to the reference potential, which is the IC ground in the example shown in FIG. 3A.

In any event, the first and second voltage dividers that form the multi-tap voltage divider discussed above are thus coupled in series with one another such that the multitap voltage divider forms a path between the internal supply voltage VDD_int and the reference potential, which is an IC ground as shown in FIG. 3A by way of example and not limitation. It is noted that the IC 302 may implement any suitable voltage supply scheme, and thus use any suitable voltage as a reference potential, in various embodiments. Moreover, although the multi-tap voltage divider includes two voltage dividers as shown in FIGS. 3A and 3B, the embodiments are not limited to this particular arrangement or number of resistors. In various embodiments, the voltage regulator 204.1 may be implemented using any suitable number and/or arrangement of resistors coupled between the operational amplifier 320, the internal supply voltage VDD_int, and the reference potential to form any suitable type of feedback path. Thus, in such cases the amplitude and/or polarity of the control current may be modified from the example shown in FIGS. 3A and 3B based upon the architecture and/or number of resistors implemented, as such changes will impact the relationship between the control current and the supply voltage VDD_int.

Figure 3B:
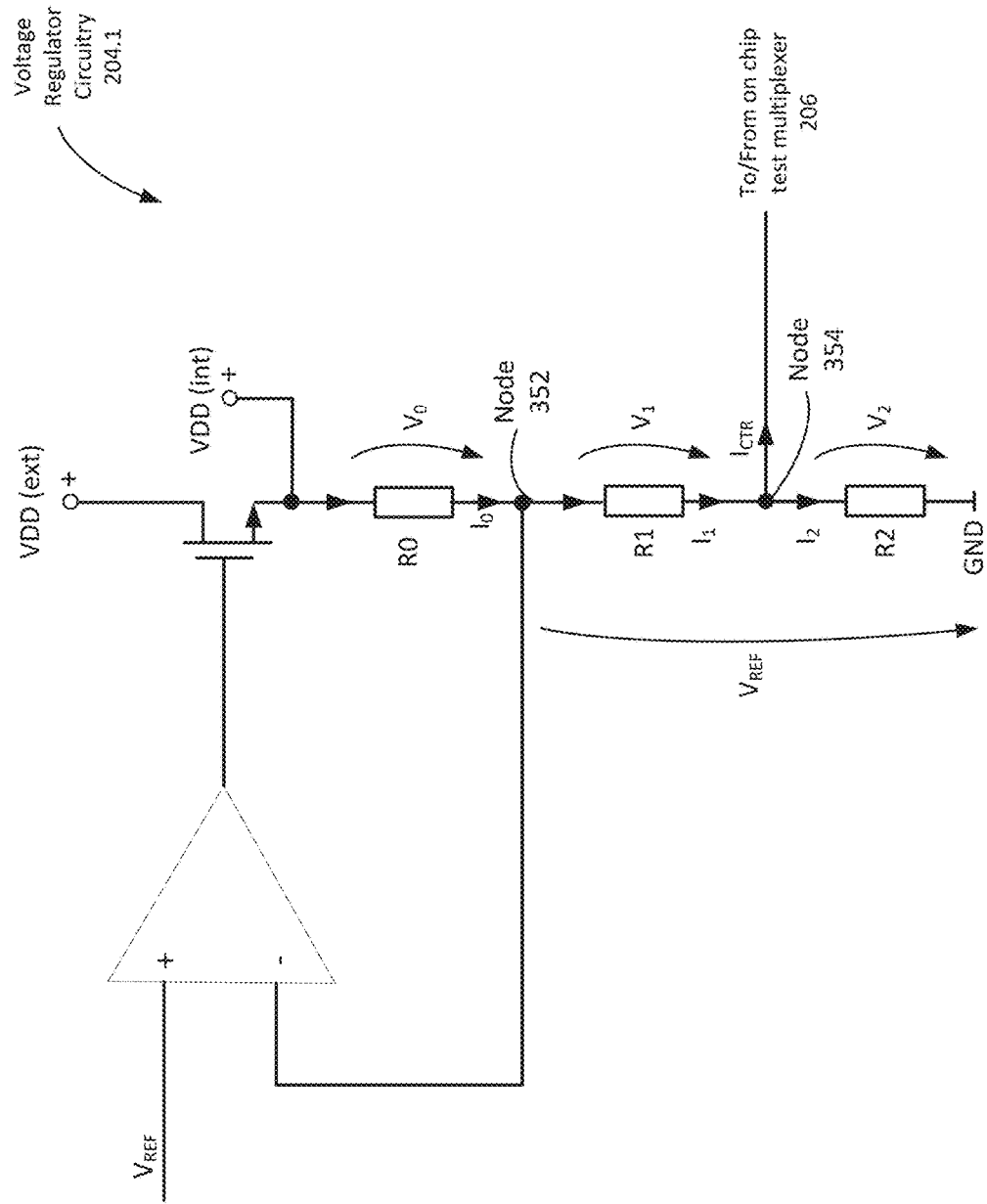
FIG. 3B illustrates the node voltages and currents of the current-controlled voltage regulator test configuration as shown in FIG. 3A, in accordance with an embodiment of the present disclosure.

In any event, instead of the internal supply voltage VDD_int being coupled to a reference potential via a conventional single-tap voltage divider architecture, the use of the multi-tap voltage divider as shown in the example IC 302 in FIGS. 3A and 3B enables the use of the control current to control an adjustment of the internal supply voltage VDD_int to different test voltages, as discussed in further detail herein. To do so, and as shown in FIG. 3A and discussed above with respect to FIG. 2, the IC chip 302 also comprises the on-chip test multiplexer circuitry 206, which is configured to selectively couple the control current between the node 354 of the second voltage divider (i.e. the junction of the resistors R1 and R2) and the test interface 212.

In doing so, the on-chip test multiplexer 206 facilitates the test device 250 coupling the generated control current, which is sunk into the node 354 or sourced out of the node 354, the latter being shown in FIG. 3A. Again, the on-chip test multiplexer 206 enables other portions of the IC chip 302 to be tested, which may include the adjustment of internal supply voltages identified with separate voltage regulator circuitries as noted above with respect to FIG. 2. Thus, although the on-chip test multiplexer 206 is shown in FIG. 3A as having a single pole and four throws (SP4T), the on-chip test multiplexer 206 may have any suitable number of poles and/or throws to enable the routing of the control current (or any other suitable signals, voltages, currents, etc.) within the IC chip 302 and/or between the IC chip 302 and the test device 250 to support any suitable number of different test configurations.

As a function of the amplitude and polarity of the control current (i.e. the polarity meaning the control current being sunk into the node 354 or sourced out of the node 354, as shown in FIG. 3A), the internal supply voltage VDD_int is adjusted in a manner that allows for the operation of the supply test circuitry 208 to be tested and verified. Again, the supply test circuitry 208 is configured to selectively generate output monitoring signals (e.g. the "VDD too high" or the "VDD too low" signals) based upon the adjusted internal supply voltage and, specifically, whether the adjusted internal supply voltage VDD_int is greater than or less than respective threshold voltages (e.g. the threshold voltages $V_{Hi}$ and $V_{LO}$, respectively). For instance, the control current controls an adjustment of the internal supply voltage VDD_int to increase or decrease the internal supply voltage VDD_int as a function of the control current's amplitude and polarity. Specifically, the control current increases the internal supply voltage VDD_int as a linear function of the control current when the polarity of the control current is flowing into the node 354 of the second voltage divider (i.e. +$I_{CTR}$, not shown). Furthermore, the control current decreases the internal supply voltage VDD_int as a linear function of the control current when the polarity of the control current is flowing out of the node 354 of the second voltage divider (i.e. −$I_{CTR}$, as shown in FIG. 3A).

Thus, the control current $I_{CTR}$ may be used in this way to control the adjustment of the internal supply voltage VDD_int in a predictable and repeatable way. For example, the control current may be sourced by the test device 250 (i.e. flow into the node 354, which is not shown in FIG. 3A) and have a predetermined amplitude to increase the internal supply voltage VDD_int to a first test voltage that is greater than the threshold high voltage $V_{HI}$ by any suitable proportion, such as by 1%, 5%, 10%, etc. As another example, the control current may have a predetermined amplitude and be sunk by the test device 250 (i.e. flow out of the node 354, as shown in FIG. 3A) to decrease the internal supply voltage VDD_int to a second test voltage that is less than the threshold low voltage $V_{LO}$ by any suitable proportion, such as by 1%, 5%, 10%, etc.

Again, in response, the supply test circuitry 208 is configured to output a first output monitoring signal (e.g. "VDD too high") when the first test voltage (i.e. the adjusted supply voltage VDD_int) is greater than the threshold high voltage $V_{HI}$, and to output a second monitoring signal (e.g. "VDD too low") when the second test voltage (i.e. the adjusted supply voltage VDD_int) is less than the threshold low voltage $V_{LO}$. In other words, the threshold low voltage $V_{LO}$ and the threshold high voltage $V_{HI}$ are identified with a predetermined operating voltage range of the internal supply voltage VDD_int, such that the first test voltage and the second test voltage represent respective voltage values that correspond to the internal supply voltage VDD_int deviating outside of its predetermined operating voltage range, thereby triggering a respective output monitoring signal to be generated via the supply test circuitry 208. In this way, by adjusting the control current amplitude and polarity, which in turn adjusts the internal supply voltage VDD_int, the operation of the supply test circuitry 208 may be verified. Additional details regarding how the control current $I_{CTR}$ adjusts the voltage of the internal supply voltage VDD_int is further discussed below with respect to FIG. 3B.

FIG. 3B illustrates the node voltages and currents of the current-controlled voltage regulator test configuration as shown in FIG. 3A, in accordance with an embodiment of the present disclosure. The voltage regulator as 204.1 is shown in FIG. 3B and includes the same components as those shown in FIG. 3A, with some components of the IC 302 being removed in FIG. 3B for ease of explanation. Thus, the same components of the voltage regulator 204.1 are not re-labeled in FIG. 3B for purposes of brevity.

As shown in FIG. 3B, the node 352 has a voltage equal to (excepting for tolerances) the reference voltage $V_{REF}$ by way of the virtual short circuit between the input terminals of the operational amplifier 320. Again, by adjusting the amplitude and polarity (i.e. direction) of the control current $I_{CTR}$, the internal supply voltage VDD_int may be adjusted. As will be demonstrated in further detail below, the internal supply current VDD_int and the control current $I_{CTR}$ have a linear relationship between one another, such that the internal supply voltage VDD_int is adjusted linearly with changes in the amplitude and polarity of the control current $I_{CTR}$.

For example, the node 352 has a voltage equal to the reference voltage $V_{REF}$, as shown in FIG. 3B. Moreover, and with respect to the second voltage divider, the voltage drop across the resistor R1 is represented as $V_1$, and the voltage drop across the resistor R2 is represented as $V_2$. Therefore, the node 352 has a voltage equal to the reference voltage $V_{REF}$, which is equal to the sum of the voltage drops across both the resistors R1 and R2 in accordance with Equation 1 below as follows:

$$V_{REF} = V_1 + V_2 \qquad \text{Eqn. 1:}$$

Furthermore, based upon the Kirchhoff's Current Law, the current $I_1$ flowing through the resistor R1, the current $I_2$ flowing through the resistor R2, and the control current $I_{CTR}$ have the following relationship with respect to one another, which is represented in Equations 2A and 2B below as follows:

$$I_2 = I_1 - I_{CTR} \text{ (when the control current is flowing out of the node 354)} \qquad \text{Eqn. 2A:}$$

$$I_2 = I_1 + I_{CTR} \text{ (when the control current is flowing into the node 354)} \qquad \text{Eqn. 2B:}$$

For the purposes of the following analysis, the condition for Eqn. 2A will be used, as this is the scenario illustrated in FIG. 3B. With this in mind, it is noted that from Ohm's Law, the following equivalence may be made between the voltage drops across the resistors R1 and R2 and the current flowing through the respective resistors, which is represented in accordance with Equation 3 below as follows:

$$V_{REF} = V_1 + V_2 = I_1 \cdot R_1 + I_2 \cdot R_2 \qquad \text{Eqn. 3:}$$

By substituting the value of the current $I_2$ as defined above in Eqn. 2A into Eqn. 3, the following relationship is formed in accordance with Equation 4 below as follows:

$$V_{REF} = V_1 + V_2 = \qquad \text{Eqn. 4}$$
$$I_1 \cdot R_1 + I_2 \cdot R_2 = I_1 \cdot R_1 + (I_1 - I_{CTR}) \cdot R_2 = I_1(R_1 + R_2) - I_{CTR}R_2$$

It is also noted that the current $I_0$ flowing through the resistor R0 from the node identified with the internal supply voltage VDD_int is equal to the current flowing through the resistor R1. By using this equivalence, and applying the relationship between the reference voltage $V_{REF}$ and the current $I_1$ from Eqn. 4 above, the current $I_0$ may be expressed as follows in accordance with Equation 5 as follows:

$$I_1 = I_0 = \frac{V_{REF} + I_{CTR}R_2}{(R_1 + R_2)} \qquad \text{Eqn. 5}$$

From an analysis of the voltage regulator 204.1 in FIG. 3A, it is further noted that the internal supply voltage VDD_int is equal to the sum of the voltages to the reference potential, i.e. the voltage drops across each of the resistors R0, R1, and R2. By applying Ohm's law, the internal supply voltage VDD_int may thus be represented in accordance with Equation 6 below as follows:

$$\text{VDD\_int} = V_0 + V_1 + V_2 = V_0 V_{REF} = I_0 R_0 V_{REF} \qquad \text{Eqn. 6:}$$

By substituting the value of the current $I_0$ as shown in Eqn. 5 above, the following equivalence is thus established in accordance with Equation 7 below as follows:

$$\text{VDD\_int} = \left[ \frac{V_{REF} + I_{CTR}R_2}{(R_1 + R_2)} \right] \cdot R_0 + V_{REF} \qquad \text{Eqn. 7}$$

Finally, this leads to a linear equation in the form of y=ax+b, which illustrates the linear relationship between the internal supply voltage VDD_int and the control current $I_{CTR}$ in accordance with Equation 8 below as follows:

$$\text{VDD\_int} = ax + b = R_2 \frac{R_0}{R_1 + R_2} I_{CTR} + \frac{V_{REF}(R_0 + R_1 + R_2)}{(R_1 + R_2)} \qquad \text{Eqn. 8}$$

In other words, the control current $I_{CTR}$ represents the variable 'x' and the internal supply voltage VDD_int is thereby adjusted for changes in the control current $I_{CTR}$ in a linear manner. Thus, the proportionality between the internal supply voltage VDD_int and the control current $I_{CTR}$ is represented by the constant term formed by the resistors R0, R1, and R2, i.e.

$$R_2 \frac{R_0}{R_1 + R_2}.$$

The offset 'b' is represented as the constant formed by the product of the reference voltage and the ratio formed by the resistors R0, R1, and R2, i.e.

$$\frac{V_{REF}(R_0 + R_1 + R_2)}{(R_1 + R_2)}.$$

Thus, the control current amplitude and polarity may be provided to adjust the internal supply voltage VDD_int based upon the reference voltage and the values of the resistors R0, R1, and R2. It is noted that the resistors R0, R1, and R2 (or additional or alternative resistors, as the case may be) that form the multi-tap voltage divider as discussed herein may have any suitable Ohmic value, including zero Ohms, to provide the desired proportionality between the internal supply voltage VDD_int and the control current $I_{CTR}$.

Figure 4:
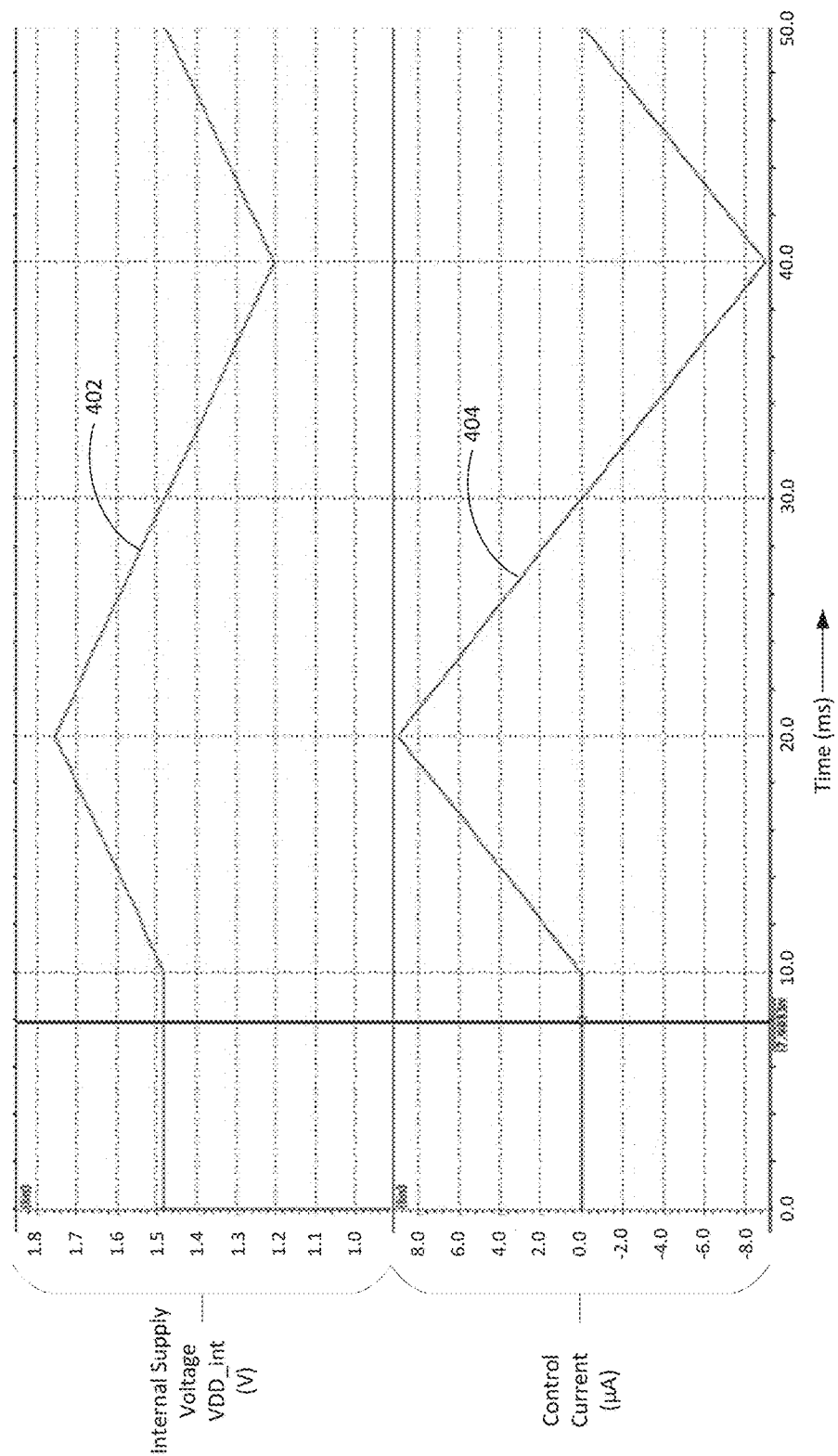
FIG. 4 illustrates an example graph showing the relationship between the control current and the internal supply voltage, in accordance with an embodiment of the present disclosure.

An example simulation of a graph 400 showing the relationship between the control current and the internal supply voltage is shown in FIG. 4. As shown in FIG. 4, the internal supply voltage VDD_int has a nominal voltage of slightly less than 1.5 Volts when no control current is applied. Thus, for the example simulation as shown in FIG. 4, the reference voltage is assumed to have a value of ~1.2 V, and the internal supply voltage VDD_int has a nominal (i.e. unadjusted) value of ~1.48 V, which may be the case, for example, when the external supply voltage VDD_ext is 1.5V. However, these values are provided by way of example, and the embodiments discussed herein may utilize any suitable values for the reference voltage, the internal supply voltage, and the external supply voltage.

As further shown in FIG. 4, the trace 402 shows that the internal supply voltage VDD_int is adjusted to a value of about 1.75V for a corresponding control current amplitude of about +10 uA (i.e. for the control current flowing into the node 354). Furthermore, and as shown in FIG. 4, the trace 404 shows that the internal supply voltage VDD_int is adjusted to a value of about 1.20V for a corresponding control current amplitude of about −10 uA (i.e. for the control current flowing out of the node 354, as shown in FIGS. 3A-3B). It can thus be observed from the traces 402, 404, that the relationship between the internal supply voltage VDD_int and the control current $I_{CTR}$ track one another in accordance with a linear relationship, i.e. the internal supply voltage VDD_int is adjusted as a linear function of the control current $I_{CTR}$.

Thus, assuming that the threshold high voltage $V_{HI}$ is less than 1.75 V, and that the threshold low voltage $V_{LO}$ is greater than 1.20V, the relationship between the control current $I_{CTR}$ and the internal supply voltage VDD_int enables the supply test circuitry 208 to be tested. This may be achieved, for instance, by verifying the generation of the "VDD too high" and "VDD too low" output monitoring signals in response to the adjusted internal supply voltage VDD_int in each respective scenario.

Figure 5:
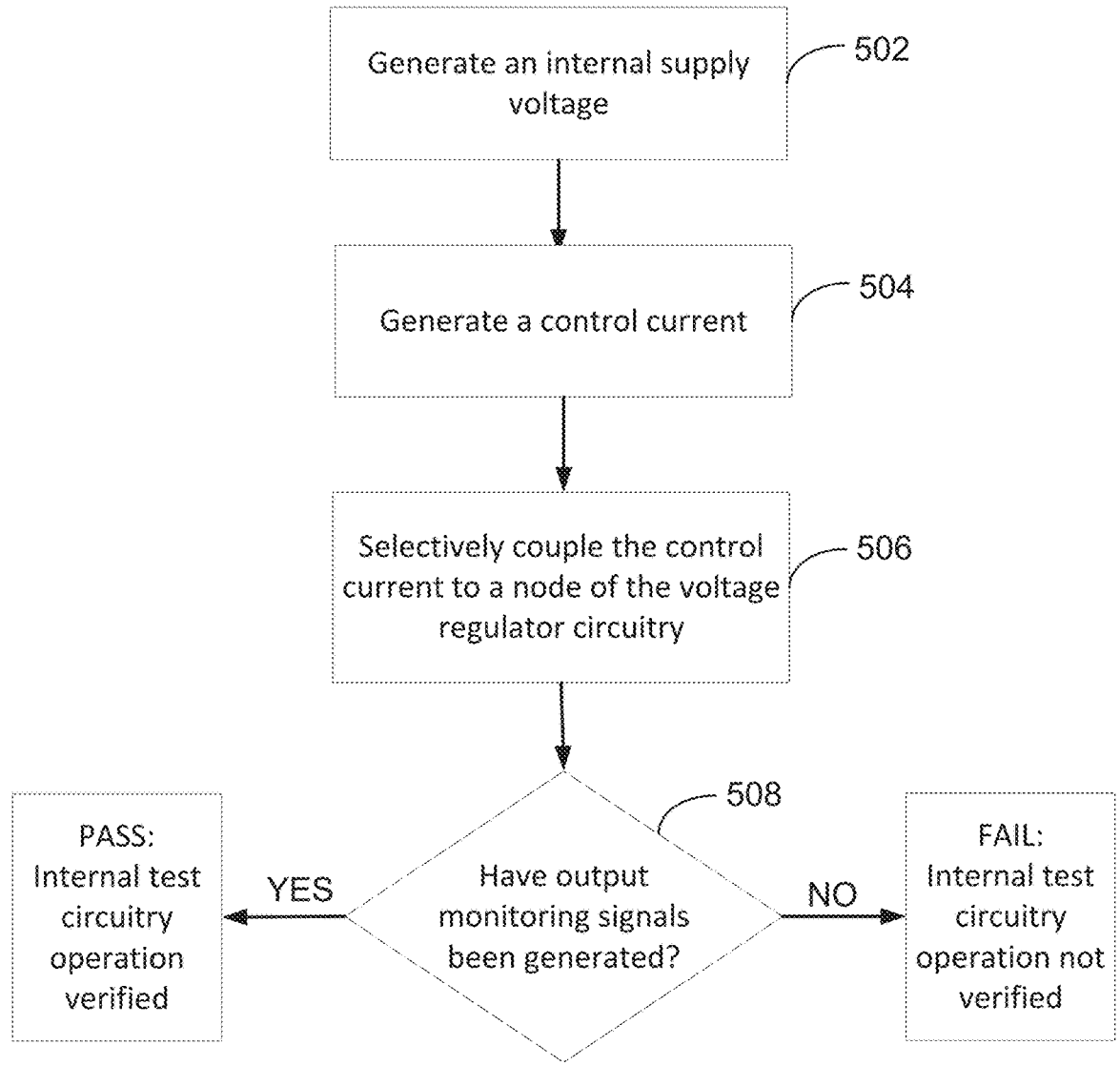
FIG. 5 illustrates an example process flow, in accordance with an embodiment of the present disclosure.

FIG. 5 illustrates an example process flow, in accordance with an embodiment of the present disclosure. With reference to FIG. 5, the process flow 500 may be executed by and/or otherwise associated with processing circuitry. The processing circuitry may be associated with one or more components of the test device 250 as discussed herein (e.g. the adjustable current source 252 and/or the controller 254) and/or one or more components of the IC 202/302 (e.g. the voltage regulator circuitry 204.1, the on-chip test multiplexer 206, and/or the supply test circuitry 208) as discussed herein. The process flow 500 may include alternate or additional steps that are not shown in FIG. 5 for purposes of brevity, and may be performed in a different order than the steps shown in FIG. 5.

Flow 500 may begin by generating (block 502) an internal supply voltage. This may be performed, for example, by a voltage regulator (e.g. voltage regulator circuitry 204.1) of the IC that is to undergo a test procedure using a control current as discussed herein. Again, this internal supply voltage may be identified with the internal supply voltage VDD_int, and have any suitable voltage value.

The process flow 500 may further include generating (block 504) a control current. Again, this control current may be generated having a predetermined amplitude and polarity to adjust the internal supply current to a predetermined test point. Thus, the control current may be generated having the predetermined amplitude and polarity based upon the linear relationship between the internal supply voltage and the control current, which may be known a priori based upon the architecture of the voltage regulator circuitry, as discussed herein.

The process flow 500 may further include selectively coupling (block 506) the control current to a node of the voltage regulator circuitry that is identified with the generation of the internal supply voltage. This may be performed, for instance, via the use of the on-chip test multiplexer 206 as discussed herein, which may couple the generated test current between the node 354 of the voltage regulator circuitry 204.1 and the test device 250 via the test interface 212 and the test interconnections 256. The application of the control current adjusts the internal supply voltage to predetermined test voltages to facilitate testing of the internal test circuitry of the IC (e.g. the supply test circuitry 208), as noted above.

The process flow 500 may further include determining (block 508) whether the relevant output monitoring signals have been generated by the internal test circuitry in response to the adjustment of the internal supply voltage. This may include, for example, monitoring or otherwise identifying the generation of the "VDD too high" and "VDD too low" signals in response to the adjusted internal supply voltage VDD_int in each respective scenario, as noted herein. Again, it is noted that the determination of whether the output monitoring signals are generated may be made by the IC 202/302 as part of test procedure. Additionally or alternatively, the determination of whether the output monitoring signals are generated may be made by the test device 250, e.g. via communication with the IC chip 202/302 as noted herein.

EXAMPLES

The techniques of this disclosure may also be described in the following examples.

Example 1. An integrated circuit (IC) chip, comprising: voltage regulator circuity configured to generate an internal supply voltage based upon an external supply voltage and a reference voltage, the voltage regulator circuitry comprising a voltage divider having a plurality of taps; an on-chip test multiplexer configured to selectively couple a control current between one of the plurality of taps of the voltage divider and a test interface, the control current controlling an adjustment of the internal supply voltage; and internal test circuitry configured to selectively generate an output monitoring signal based upon the adjustment of the internal supply voltage.

Example 2. The IC chip of Example 1, wherein the control current controls an adjustment of the internal supply voltage to one of (i) a first test voltage that is greater that the internal supply voltage, or (ii) a second test voltage that is less than the internal supply voltage.

Example 3. The IC chip of any combination of Examples 1-2, wherein the internal test circuitry is configured to generate the output monitoring signal when the first test voltage or the second test voltage indicates that the internal supply voltage has deviated outside of a predetermined operating voltage range.

Example 4. The IC chip of any combination of Examples 1-3, wherein the control current increases or decreases the internal supply voltage based upon a polarity of the control current.

Example 5. The IC chip of any combination of Examples 1-4, wherein the control current increases the internal supply voltage when the control current flows into the tap of the voltage divider, and decreases the internal supply voltage when the control current flows out of the tap of the voltage divider.

Example 6. The IC chip of any combination of Examples 1-5, wherein a first one of the plurality of taps of the voltage divider is coupled to an inverting input of an operational amplifier, and wherein a second one of the plurality of taps of the voltage divider is coupled to the on-chip test multiplexer.

Example 7. The IC chip of any combination of Examples 1-6, wherein the voltage divider comprises a first resistor and a second resistor, and wherein the first resistor is coupled to the internal supply voltage.

Example 8. The IC chip of any combination of Examples 1-7, wherein: the voltage divider further comprises a third resistor, the first resistor and the second resistor are coupled to an inverting input of an operational amplifier, the non-inverting input of the operational amplifier being coupled to the reference voltage, and the third resistor is coupled to a reference potential.

Example 9. The IC chip of any combination of Examples 1-8, wherein the tap of the voltage divider to which the control current is selectively coupled comprises a node formed by a connection between the second resistor and the third resistor.

Example 10. The IC chip of any combination of Examples 1-9, wherein: the voltage divider further comprises a third resistor, the first resistor is coupled to the internal supply voltage and to an inverting input of an operational amplifier, the second resistor is coupled to the inverting input of the operational amplifier and to the on-chip test multiplexer, and the third resistor is coupled to the on-chip test multiplexer test and an IC ground.

Example 11. The IC chip of any combination of Examples 1-10, wherein the control current controls an adjustment of the internal supply voltage in accordance with a linear relationship between the control current and the internal supply voltage.

Example 12. The IC chip of any combination of Examples 1-11, wherein the control current is generated via a current source identified with a test device that is coupled to the IC chip via the test interface.

Example 13. An integrated circuit (IC) chip, comprising: voltage regulator circuity configured to generate an internal supply voltage based upon an external supply voltage and a reference voltage, the voltage regulator circuitry including a set of resistors coupled in series with one another between the internal supply voltage and a reference potential; a test interface configured to selectively couple a control current between an external test device and the IC chip, wherein the control current, when coupled to a tap of the set of resistors, controls an adjustment of the internal supply voltage in accordance with a linear relationship between the control current and the internal supply voltage; and internal test circuitry configured to selectively generate an output monitoring signal based upon the adjusted internal supply voltage.

Example 14. The IC chip of Example 13, further comprising: an on-chip test multiplexer configured to selectively couple the control current between the tap of the set of resistors and the test interface.

Example 15. The IC chip of any combination of Examples 13-14, wherein the control current controls an adjustment of the internal supply voltage to one of (i) a first test voltage that is greater that the internal supply voltage, or (ii) a second test voltage that is less than the internal supply voltage.

Example 16. The IC chip of any combination of Examples 13-15, wherein the internal test circuitry is configured to generate the output monitoring signal when the first test voltage or the second test voltage indicates that the internal supply voltage has deviated outside of a predetermined operating voltage range.

Example 17. The IC of any combination of Examples 13-16, wherein the control current increases or decreases the internal supply voltage based upon a polarity of the control current.

Example 18. The IC chip of any combination of Examples 13-17, wherein the control current increases the internal supply voltage when the control current flows into the tap of the set of resistors, and decreases the internal supply voltage when the control current flows out of the tap of the set of resistors.

Example 19. The IC chip of any combination of Examples 13-18, wherein the tap of the set of resistors is coupled to the on-chip test multiplexer, and wherein a further tap of the set of resistors is coupled to an inverting input of an operational amplifier.

Example 20. The IC chip of any combination of Examples 13-19, wherein the set of resistors comprises a first resistor and a second resistor, and wherein the first resistor is coupled to the internal supply voltage.

Example 21. The IC chip of any combination of Examples 13-20, wherein: the set of resistors further comprises a third resistor, the first resistor and the second resistor are coupled to an inverting input of an operational amplifier, the non-inverting input of the operational amplifier being coupled to the reference voltage, and the third resistor is coupled to a reference potential.

Example 22. The IC chip of any combination of Examples 13-21, wherein the tap of the set of resistors, to which the control current is selectively coupled, comprises a node formed by a connection between the second resistor and the third resistor.

Example 23. The IC chip of any combination of Examples 13-22, wherein: the set of resistors comprises a first resistor, a second resistor, and a third resistor, the first resistor is coupled to the internal supply voltage and to an inverting input of an operational amplifier, the second resistor is coupled to the inverting input of the operational amplifier and to the on-chip test multiplexer, and the third resistor is coupled to the on-chip test multiplexer test multiplexer and an IC ground.

Example 24. The IC chip of any combination of Examples 13-23, wherein the control current is generated via a current source identified with the external test device.

CONCLUSION

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof. The term "data" may be interpreted to include any form of representation data. The term "information" may in addition to any form of digital information also include other forms of representing information. The term "entity" or "unit" may in embodiments include any device, apparatus circuits, hardware, software, firmware, chips, or other semiconductors as well as logical units or physical implementations of protocol layers etc. Furthermore, the terms "coupled" or "connected" may be interpreted in a broad sense not only covering direct but also indirect coupling.

It is further to be noted that methods disclosed in the specification or in the claims may be implemented by a device having means for performing each of the respective steps of these methods.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. An integrated circuit (IC) chip, comprising:
voltage regulator circuitry configured to generate an internal supply voltage based upon an external supply voltage and a reference voltage, the voltage regulator circuitry comprising a voltage divider having a plurality of taps;
an on-chip test multiplexer configured to selectively couple a control current between one of the plurality of taps of the voltage divider and a test interface, the control current controlling an adjustment of the internal supply voltage; and
internal test circuitry configured to selectively generate an output monitoring signal based upon the adjustment of the internal supply voltage,
wherein the control current increases the internal supply voltage when the control current flows into the one of the plurality of taps of the voltage divider, and decreases the internal supply voltage when the control current flows out of the one of the plurality of taps of the voltage divider.

2. The IC chip of claim 1, wherein the control current controls an adjustment of the internal supply voltage to one of (i) a first test voltage that is greater that-than the internal supply voltage, or (ii) a second test voltage that is less than the internal supply voltage.

3. The IC chip of claim 2, wherein the internal test circuitry is configured to generate the output monitoring signal when the first test voltage or the second test voltage indicates that the internal supply voltage has deviated outside of a predetermined operating voltage range.

4. The IC chip of claim 1, wherein the control current increases or decreases the internal supply voltage based upon a polarity of the control current.

5. The IC chip of claim 1, wherein a first one of the plurality of taps of the voltage divider is coupled to an inverting input of an operational amplifier, and
wherein a second one of the plurality of taps of the voltage divider is coupled to the on-chip test multiplexer.

6. The IC chip of claim 1, wherein the voltage divider comprises a first resistor and a second resistor, and
wherein the first resistor is coupled to the internal supply voltage.

7. The IC chip of claim 6, wherein:
the voltage divider further comprises a third resistor,
the first resistor and the second resistor are coupled to an inverting input of an operational amplifier, a non-inverting input of the operational amplifier being coupled to the reference voltage, and
the third resistor is coupled to a reference potential.

8. The IC chip of claim 7, wherein the one of the plurality of taps of the voltage divider to which the control current is selectively coupled comprises a node formed by a connection between the second resistor and the third resistor.

9. The IC chip of claim 6, wherein:
the voltage divider further comprises a third resistor,
the first resistor is coupled to the internal supply voltage and to an inverting input of an operational amplifier,
the second resistor is coupled to the inverting input of the operational amplifier and to the on-chip test multiplexer, and
the third resistor is coupled to the on-chip test multiplexer and an IC ground.

10. The IC chip of claim 1, wherein the control current controls an adjustment of the internal supply voltage in accordance with a linear relationship between the control current and the internal supply voltage.

11. The IC chip of claim 1, wherein the control current is generated via a current source identified with a test device that is coupled to the IC chip via the test interface.

12. An integrated circuit (IC) chip, comprising:
voltage regulator circuitry configured to generate an internal supply voltage based upon an external supply voltage and a reference voltage, the voltage regulator circuitry including a set of resistors coupled in series with one another between the internal supply voltage and a reference potential;
a test interface configured to selectively couple a control current between an external test device and the IC chip,
wherein the control current, when coupled to a tap of the set of resistors, controls an adjustment of the internal supply voltage in accordance with a linear relationship between the control current and the internal supply voltage; and
internal test circuitry configured to selectively generate an output monitoring signal based upon the adjusted internal supply voltage, wherein the control current increases the internal supply voltage when the control current flows into the tap of the set of resistors, and decreases the internal supply voltage when the control current flows out of the tap of the set of resistors.

13. The IC chip of claim 12, further comprising:
an on-chip test multiplexer configured to selectively couple the control current between the tap of the set of resistors and the test interface.

14. The IC chip of claim 13, wherein the tap of the set of resistors is coupled to the on-chip test multiplexer, and
wherein a further tap of the set of resistors is coupled to an inverting input of an operational amplifier.

15. The IC chip of claim 13, wherein:
the set of resistors comprises a first resistor, a second resistor, and a third resistor,
the first resistor is coupled to the internal supply voltage and to an inverting input of an operational amplifier,
the second resistor is coupled to the inverting input of the operational amplifier and to the on-chip test multiplexer, and
the third resistor is coupled to the on-chip test multiplexer and an IC ground.

16. The IC chip of claim 12, wherein the control current controls an adjustment of the internal supply voltage to one of (i) a first test voltage that is greater that the internal supply voltage, or (ii) a second test voltage that is less than the internal supply voltage.

17. The IC chip of claim 16, wherein the internal test circuitry is configured to generate the output monitoring signal when the first test voltage or the second test voltage indicates that the internal supply voltage has deviated outside of a predetermined operating voltage range.

18. The IC of claim 12, wherein the control current increases or decreases the internal supply voltage based upon a polarity of the control current.

19. The IC chip of claim 12, wherein the set of resistors comprises a first resistor and a second resistor, and
wherein the first resistor is coupled to the internal supply voltage.

20. The IC chip of claim 19, wherein:
the set of resistors further comprises a third resistor,
the first resistor and the second resistor are coupled to an inverting input of an operational amplifier, a non-inverting input of the operational amplifier being coupled to the reference voltage, and
the third resistor is coupled to a reference potential.

21. The IC chip of claim 20, wherein the tap of the set of resistors, to which the control current is selectively coupled, comprises a node formed by a connection between the second resistor and the third resistor.

22. The IC chip of claim 12, wherein the control current is generated via a current source identified with the external test device.

* * * * *